(12) United States Patent
Munakata et al.

(10) Patent No.: US 11,085,971 B2
(45) Date of Patent: Aug. 10, 2021

(54) DEGRADATION STATE DETERMINATION DEVICE AND DEGRADATION STATE DETERMINATION METHOD

(71) Applicant: Toyo System Co., Ltd., Fukushima (JP)

(72) Inventors: Ichiro Munakata, Fukushima (JP); Hideki Shoji, Fukushima (JP)

(73) Assignee: TOYO SYSTEM CO., LTD., Iwaki (JP)

( * ) Notice: Subject to any disclaimer, the term of this patent is extended or adjusted under 35 U.S.C. 154(b) by 0 days.

(21) Appl. No.: 17/042,472

(22) PCT Filed: Oct. 12, 2018

(86) PCT No.: PCT/JP2018/038056
§ 371 (c)(1),
(2) Date: Sep. 28, 2020

(87) PCT Pub. No.: WO2019/187264
PCT Pub. Date: Oct. 3, 2019

(65) Prior Publication Data
US 2021/0028510 A1    Jan. 28, 2021

(30) Foreign Application Priority Data
Mar. 28, 2018   (JP) .............................. JP2018-061133

(51) Int. Cl.
*G01R 31/392*   (2019.01)
*G01R 31/3842*   (2019.01)
(Continued)

(52) U.S. Cl.
CPC ......... *G01R 31/392* (2019.01); *G01R 31/367* (2019.01); *G01R 31/3648* (2013.01); *G01R 31/3842* (2019.01); *H01M 10/48* (2013.01)

(58) Field of Classification Search
None
See application file for complete search history.

(56) References Cited

U.S. PATENT DOCUMENTS

2014/0167657 A1*   6/2014   Nishikawa .............. B60L 58/21
                                                          318/139
2014/0269811 A1*   9/2014   Maleki .................. G01K 13/00
                                                          374/1
(Continued)

FOREIGN PATENT DOCUMENTS

JP    200698135 A    4/2006
JP    2010060384 A   3/2010
(Continued)

OTHER PUBLICATIONS

Korean Office Action dated Nov. 26, 2020 re 10-2020-7031033 (original and English translation) (22 pages).

*Primary Examiner* — Alexander Satanovsky
*Assistant Examiner* — Brent A. Fairbanks
(74) *Attorney, Agent, or Firm* — Stephen J. Kontos; PatentXP PLLC

(57) ABSTRACT

A present measurement value p (k) of each of plural characteristic parameters p, representing the characteristics of a secondary battery 220, is input to initial characteristic model to calculate an initial characteristic estimated value $p_1$ (0←k) of a first characteristic parameter as output of the initial characteristic model. A first index value $F_1$ (i) representing the present state of the target is calculated based on a present time series $P_1$ (i) of the measurement value $p_1$ (k) of the first characteristic parameter. A second index value $F_2$ (i) representing a past state of the target is calculated on the basis of a present time series $P_1$ (0←k, i) of the initial characteristic estimated value $p_1$ (0←k) of the first characteristic parameter. A degradation state of the target is determined based on the first index value $F_1$ (i) and the second index value $F_2$ (i).

6 Claims, 9 Drawing Sheets

(51) Int. Cl.
*G01R 31/367* (2019.01)
*G01R 31/36* (2020.01)
*H01M 10/48* (2006.01)

(56) References Cited

U.S. PATENT DOCUMENTS

2015/0115969 A1* 4/2015 Ishida ................ G01R 31/3842
324/426
2016/0349329 A1* 12/2016 Wada ................. G01R 31/3648
2017/0242079 A1* 8/2017 Duan ....................... B60L 58/13
2020/0057113 A1* 2/2020 Ukumori ............... H01M 10/48

FOREIGN PATENT DOCUMENTS

| JP | 2010230469 A | 10/2010 |
| JP | 2013516614 A | 5/2013 |
| JP | WO2013128635 A1 | 9/2013 |
| JP | 2015102328 A | 6/2015 |
| JP | 2017016991 A | 1/2017 |

* cited by examiner

//DEGRADATION STATE DETERMINATION DEVICE AND DEGRADATION STATE DETERMINATION METHOD

CROSS-REFERENCE TO RELATED APPLICATIONS

This patent application is a U.S. National Stage filing of, and claims priority to and all advantages of, PCT Patent Publication Number PCT/JP2018/038056 filed on Oct. 12, 2018 and Japanese Patent Application No. 2018-061133 filed on Mar. 28, 2018, the contents of both of which are incorporated herein by reference in their entireties.

TECHNICAL FIELD

The present invention relates to a system and the like for determining the degradation state of a secondary battery, such as a lithium ion battery.

BACKGROUND ART

There has been proposed a technical method for diagnosing the degradation of a secondary battery by estimating the value of a model parameter in an electrical equivalent circuit model of the secondary battery on the basis of the present measurement results of a current value, a voltage value, and an ambient temperature of the secondary battery (refer to Patent Literature 1).

CITATION LIST

Patent Literature

Patent Literature 1: Japanese Patent Application Laid-Open No. 2017-016991

SUMMARY OF INVENTION

Technical Problem

However, according to the prior art, the degradation of a secondary battery is diagnosed on the basis of the time-series amount of change of an estimated value of a model parameter, and therefore, the measurement of an initial current value and the like of the secondary battery itself is a prerequisite for determining the degree of degradation of the secondary battery from its initial state. For this reason, if an initial measurement result of a current value or the like of a target secondary battery is not available, then it is difficult to determine the state of degradation of the secondary battery.

Therefore, an object of the present invention is to provide a device and the like that make it possible to determine the state of degradation of a target secondary battery even if an initial measurement result of a characteristic parameter of the secondary battery itself is not available.

Solution to Problem

A degradation state determination device in accordance with the present invention includes: a first arithmetic processing element which inputs a present measurement value of each of a plurality of characteristic parameters representing characteristics of a secondary battery to an initial characteristic model representing an initial characteristic of a reference secondary battery having the same specifications as those of the secondary battery thereby to calculate, as an output of the initial characteristic model, an initial characteristic estimated value of a first characteristic parameter among the plurality of characteristic parameters; a second arithmetic processing element which calculates a first index value indicating a present state of the target on the basis of a present time series of a measurement value of the first characteristic parameter and which also calculates a second index value indicating an initial state of the target on the basis of a present time series of an initial characteristic estimated value of the first characteristic parameter calculated by the first arithmetic processing element; and a third arithmetic processing element which determines a degradation state with reference to an initial state of the secondary battery on the basis of the first index value and the second index value calculated by the second arithmetic processing element.

Advantageous Effect of the Invention

According to the degradation state determination device in accordance with the present invention, "the initial characteristic estimated value (an estimated value as an initial state)" of the first characteristic parameter is calculated according to the initial characteristic model, which represents the characteristics of a target, on the basis of "a present measurement value (a measurement value at the time point of determination)" of each of the first characteristic parameter and the second characteristic parameter of the target. Further, "the first index value" is calculated on the basis of the present time series of the measurement values (the time series of measurement values in a period of determination including the time point of determination) of the first characteristic parameter, and "the second index value" is calculated on the basis of the present time series of the initial characteristic estimated value (the time series of the initial characteristic estimated values in the period of determination including the time point of determination) of the first characteristic parameter. Then, the degradation state of the target is determined on the basis of "first index value" and "the second index value."

Thus, even if the initial or past measurement results of a characteristic parameter of the target to be determined, which is in a degraded state, are not available, the degradation state of the target can be determined.

DESCRIPTION OF EMBODIMENTS

Configuration of the Degradation State Determination Device

Figure 1:
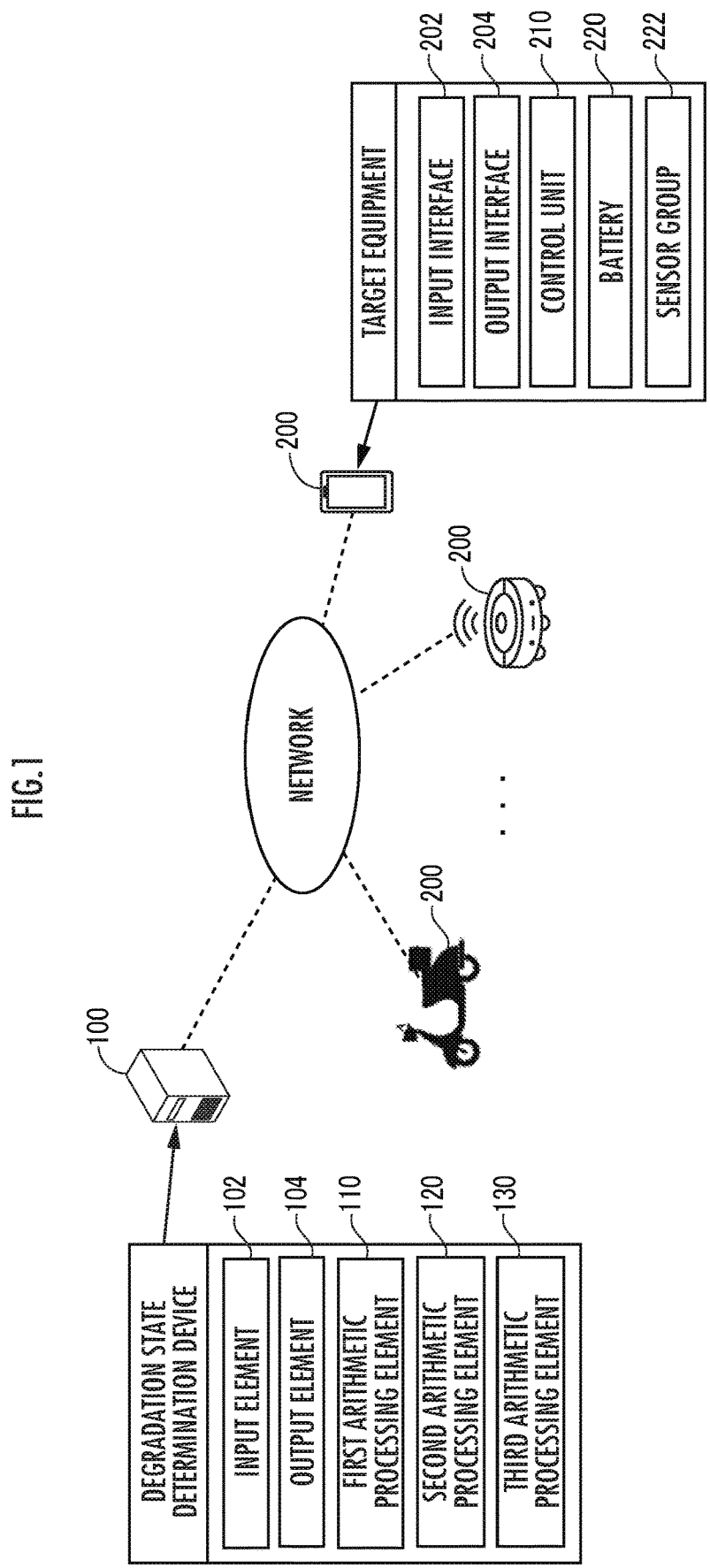
FIG. 1 is an explanatory diagram related to the configuration of a degradation state determination device as an embodiment of the present invention.

The degradation state determination device 100 as an embodiment of the present invention illustrated in FIG. 1 is composed of a single or a plurality of servers that can communicate with target equipment 200 through a network. The degradation state determination device 100 determines the degradation state of a secondary battery 220 mounted in the target equipment 200 as a power supply.

The degradation state determination device 100 includes an input element 102, an output element 104, a first arithmetic processing element 110, a second arithmetic processing element 120, and a third arithmetic processing element 130.

The input element 102 receives the measurement values of characteristic parameters from the target equipment 200 in which the secondary battery 220 is mounted. The output element 104 transmits, to the target equipment 200, a determination result of the degradation state of the secondary battery 220 or degradation diagnosis information generated on the basis of the determination result.

Each of the first arithmetic processing element 110, the second arithmetic processing element 120, and the third arithmetic processing element 130 is composed of a processor (arithmetic processing unit), a memory (storage) and an I/O circuit or the like. In addition to various data such as characteristic parameters representing the characteristics of the secondary battery 220, a program (software) is stored or retained in the memory or a storage separate from the memory. Each of a plurality of identifiers for identifying the type of the secondary battery 220 or the target equipment 200 in which the secondary battery 220 is mounted is associated with each of a plurality of models, and stored or retained in the memory. The processor reads a necessary program and data from the memory and carries out arithmetic processing on the basis of the data according to the program, thereby performing a task assigned to each of the arithmetic processing elements 110, 120 and 130.

The first arithmetic processing element 110 inputs a present measurement value p (k) of each of a plurality of characteristic parameters p=(p$_1$, . . . p$_n$), which represent the characteristics of the secondary battery 220, to an initial characteristic model thereby to calculate, as an output of the initial characteristic model, an initial characteristic estimated value p$_1$ (0←k) of the first characteristic parameter p$_1$ among the plurality of characteristic parameters p. The "initial characteristic model" denotes the initial characteristics of the secondary battery based on specifications or type. The initial characteristic model is represented by a function G according to a relational expression (110).

$$p_1(0\leftarrow k)=G(p(k)) \tag{110}$$

The function G may be defined by a relational expression (111) as a multivariable function G$_1$ having, as the main variables thereof, a second initial characteristic parameter q$_2$ (q$_1$ (p (k))) as a dependent variable of a first initial characteristic parameter q$_1$ (p (k)) according to a present measurement value p (k) of the plurality of characteristic parameters p, and a present measurement value p$_2$ (k) of a second characteristic parameter p$_2$ which is different from the first characteristic parameter p$_1$.

$$G=G_1(q_2(q_1(p(k))),p_2(k)) \tag{111}$$

The function G may be defined by a relational expression (112) as a multi variable function G$_2$ having, as the main variables thereof, a measurement value p$_1$ (j) of the first characteristic parameter p$_1$ at time point t=j at which the measurement value p$_2$ (j) of the second characteristic parameter p$_2$ becomes zero in addition to a second initial characteristic parameter q$_2$ (q$_1$ (p (k))) and a present measurement value p$_2$ (k) of the second characteristic parameter p$_2$.

$$G=G_2(q_2(q_1(p(k))),p_1(j),p_2(k)) \tag{112}$$

The second arithmetic processing element 120 calculates, as a first index value F$_1$, a cumulative value or a time integration value of a value f (p (k))=f (p$_1$ (k), p$_2$ (k), . . . ) calculated according to a multivariable function f (p) on the basis of a time series P (i)={p (i)|i=k, k+1, . . . } of the measurement value p (k) of the plurality of characteristic parameters p of the secondary battery 220 (refer to relational expression (121)).

$$F_1=\Sigma_i f(p(k)) \tag{121}$$

The second arithmetic processing element 120 calculates, as a second index value F$_2$, a cumulative value or a time integration value of a value f (p$_1$ (0←k), p$_2$ (k), . . . ) calculated according to the same multivariable function f (p) on the basis of the initial characteristic estimated value p$_1$ (0←k) of the first characteristic parameter p$_1$ and measurement values P$_u$ (k) of other characteristic parameters p$_u$ (u=2, 3 . . . ) (refer to a relational expression (122)).

$$F_2=\Sigma_i f(V(0\leftarrow k),I(k),T(k)) \tag{122}$$

The third arithmetic processing element 130 calculates a degradation degree D (i) of the secondary battery 220 according to a relational expression (130) on the basis of the first index value F$_1$ (i) and the second index value F$_2$ (i).

$$D(i)=\{F_2(i)-F_1(i)\}/F_2(i) \tag{130}$$

The target equipment 200 is provided with an input interface 202, an output interface 204, a control unit 210, the secondary battery 220, and a sensor group 222. The target equipment 200 includes every device using the secondary battery 220 as their power supply, such as a personal computer, a cellular phone (smartphone), a household appliance, or a moving body, such as an electric bicycle.

The control unit 210 is composed mainly of a processor (arithmetic processing unit), a memory (storage), and an I/O circuit. Various data, including the time series of the measurement values of characteristic parameters, is stored or retained in the memory or a storage that is separate from the memory. The control unit 210 is actuated when power is supplied from the secondary battery 220, and controls the operation of the target equipment 200 in an energized state. The operation of the target equipment 200 includes the operation of an actuator (electric actuator or the like) constituting the target equipment 200. The processor constituting the control unit 210 reads a necessary program and data from the memory to perform arithmetic processing on the basis of the data according to the program, thereby performing an assigned task.

The secondary battery 220 is, for example, a lithium ion battery or cell, or may be other secondary battery, such as a nickel-cadmium battery. The sensor group 222 measures the characteristic parameters of the secondary battery 220 and also the values of parameters necessary for controlling the target equipment 200. The sensor group 222 is composed of, for example, a voltage sensor, a current sensor, and a temperature sensor that output signals according to the voltage, the current, and the temperature of the secondary battery 220.

The degradation state determination device 100 may be mounted in the target equipment 200. In this case, a software server (not illustrated) may transmit software for determining degradation to an arithmetic processing unit constituting the control unit 210 provided in the target equipment 200 thereby to impart a function as the degradation state determination device 100 to the arithmetic processing unit.

Configuration of Each Arithmetic Processing Element

Figure 2:
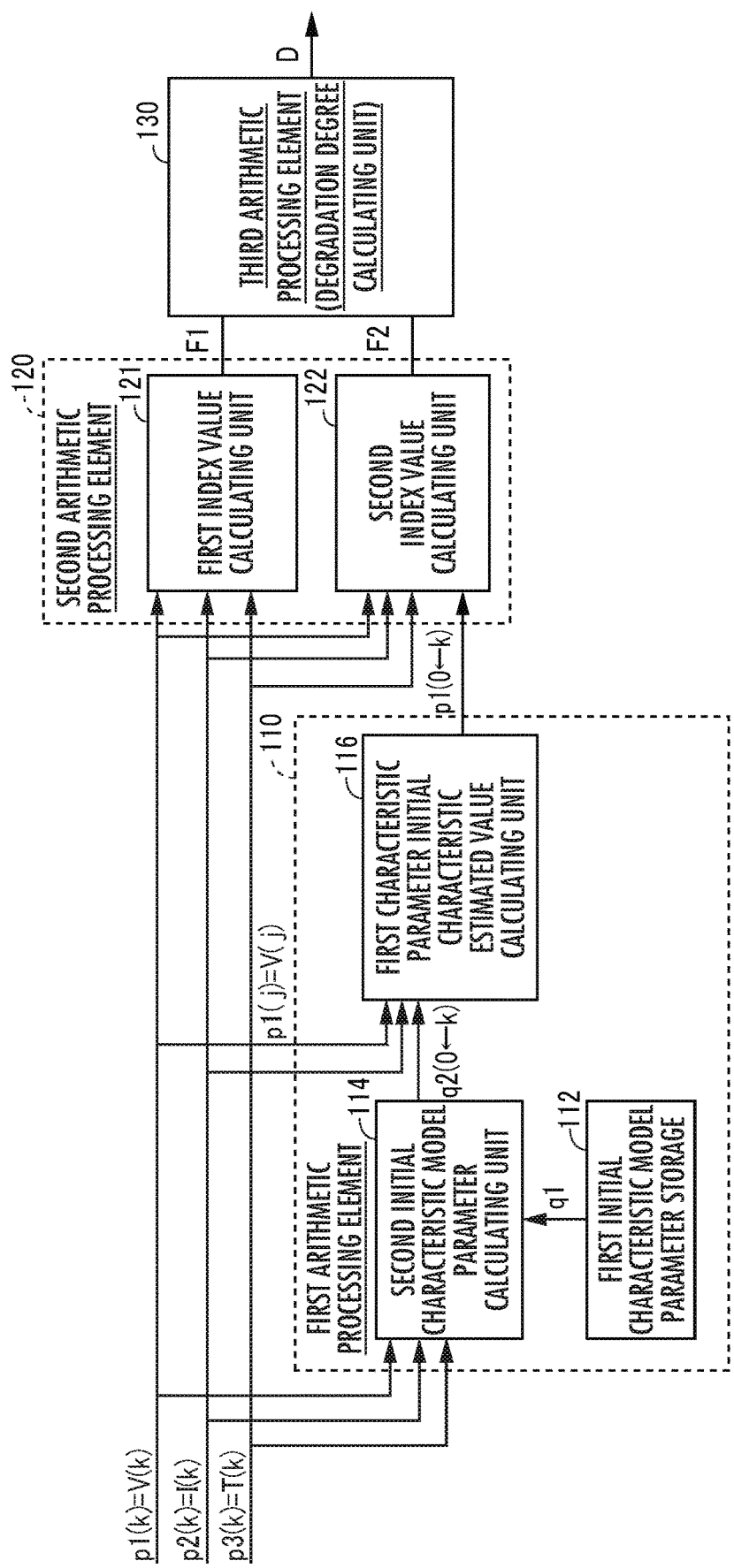
FIG. 2 is a block diagram illustrating the functions of the degradation state determination device.

FIG. 2 is a block diagram illustrating the functions of the arithmetic processing elements 110, 120 and 130.

The first arithmetic processing element 110 is provided with functions as a first initial characteristic model parameter storage 112, a second initial characteristic model parameter initial characteristic estimated value calculating unit 114, and a first characteristic parameter initial characteristic estimated value calculating unit 116. The second arithmetic processing element 120 is provided with functions as a first index value calculating unit 121 and a second index value calculating unit 122. The third arithmetic processing element 130 is provided with a function as a degradation degree calculating unit.

The first initial characteristic model parameter storage 112 stores or retains a first initial characteristic model parameter $q_1$ (p) that represents the initial characteristics of an arbitrary secondary battery of the same specifications or the same type as a reference secondary battery. The first initial characteristic model parameter $q_1$ (p) has a plurality of identifiers ID for identifying the specifications or the type of a secondary battery and a plurality of values corresponding to various measurement values p of a plurality of characteristic parameters p.

According to the present embodiment, a voltage between terminals V, a current I and a temperature T of the secondary battery 220 are measured as characteristic parameters $p=(p_1, p_2, p_3)$. The characteristic parameters $p=(p_1, p_2, p_3)$ may alternatively be (V, T, I), (I, V, T), (I, T, V), (T, I, V) or (T, V, I). The characteristic parameters p may be two $(p_1, p_2)$ or equal to or more than four $(p_1 \ldots p_N)$ $(4 \leq N)$.

Figure 3:
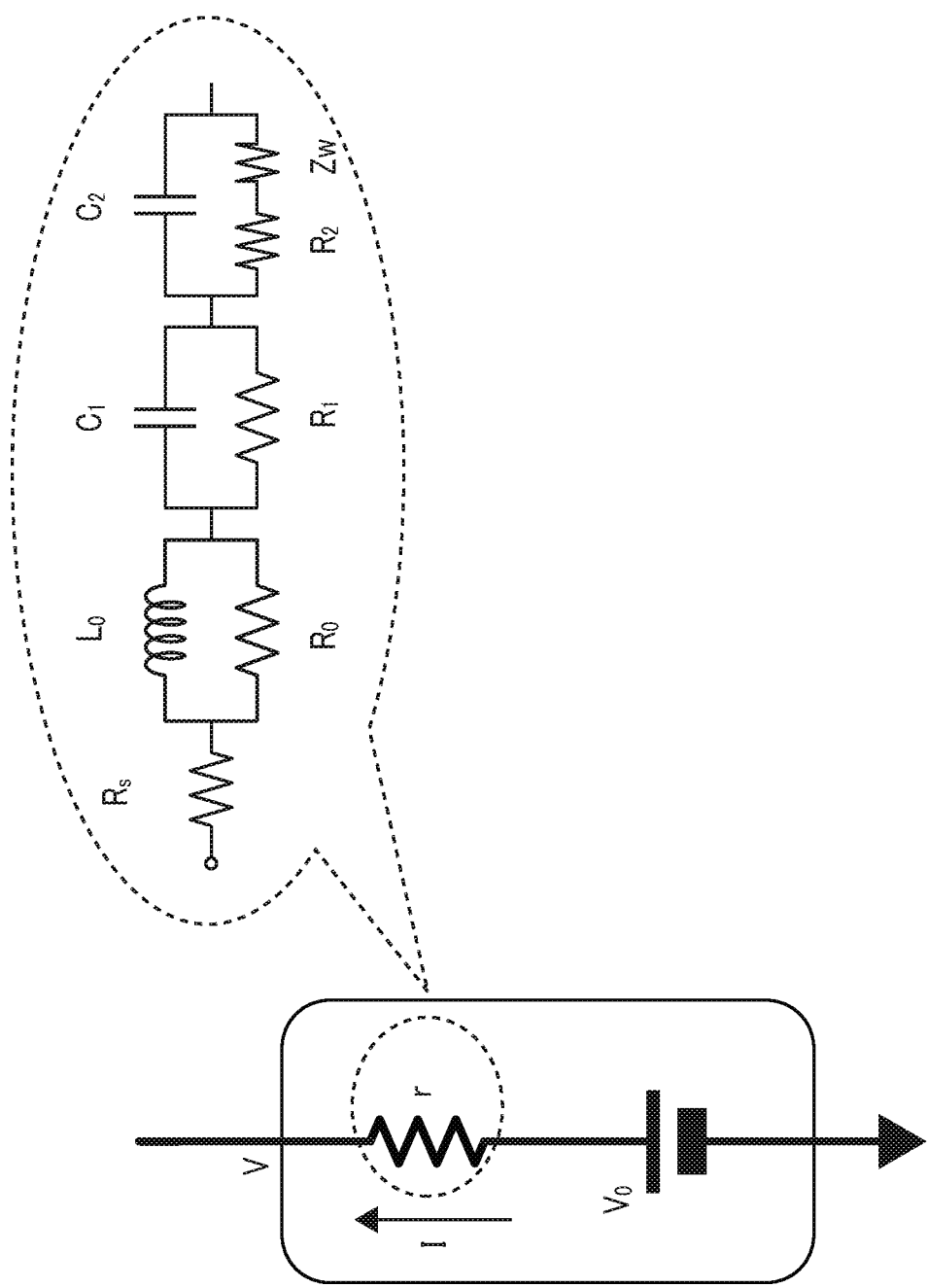
FIG. 3 is an explanatory diagram related to an example of an electrical equivalent circuit model of a battery.

For example, an initial characteristic model is defined by applying the first initial characteristic model parameter to the electrical equivalent circuit model illustrated in FIG. 3. The electrical equivalent circuit is composed of an internal power supply of an electromotive force $V_0$ and an internal resistor having a resistance value r. The electrical characteristics of the electrical equivalent circuit model of the secondary battery 220 are defined according to a relational expression (210) on the basis of the voltage between terminals V, the current I, the electromotive force $V_0$ of the internal power supply, and the resistance value r of the internal resistor of the secondary battery 220.

$$V=V_0-I \cdot r \tag{210}$$

The relationship between the voltage V (the first characteristic parameter $p_1$), the current I (the second characteristic parameter $p_2$), and the temperature T (the third characteristic parameter $p_3$) of a plurality of reference secondary batteries having different specifications and the resistance value r of the internal resistor of the secondary battery in an initial state is approximately represented by a relational expression (212) on the basis of a reference voltage $V_a$, a reference current I, and a reference temperature $T_a$.

$$r(V,I,T)=r(V_a,I_a,T_a)+(\partial r/\partial V)(V-V_a)+(\partial r/\partial I)(I-I_a)+(\partial r/\partial T)(T-T_0) \tag{212}$$

If the reference value $I_a=0$, then the reference, voltage $V_a$ corresponds to the electromotive force $V_0$, and therefore, the relational expression (212) is represented by a relational expression (214).

$$r(V,I,T)=r(V_0,0,T_a)+(\partial r/\partial V)(V-V_0)+(\partial r/\partial I)I+(\partial r/\partial T)(T-T_a) \tag{214}$$

The voltage V, the current I and the temperature T of the secondary battery in the initial state are measured, and based on the measurement results, a partial derivative $(\partial r/\partial p_s)$ (s=1, 2, 3) is calculated for each of various combinations of $p=(V, I, T)$. The partial derivative $(\partial r/\partial p_s)$ calculated for an arbitrary p as described above is stored or retained as the first initial characteristic model parameter $q_1$ (p) in the first initial characteristic model parameter storage 112. Based on the calculation result of a discrete partial derivative $(\partial r/\partial p_s)$, the $(\partial r/\partial p_s)$ for $p=(V, I, T)$ may be approximately represented by a continuous function, and the continuous function may be stored or retained in the first initial characteristic model parameter storage 112 as the first initial characteristic model parameter $q_1$ (p).

An electrical equivalent circuit model that takes transient response characteristics of the internal resistor into account may be constructed. For example, as illustrated in the upper right area of FIG. 3, the internal resistor may be configured by connecting in series a resistor (the resistance value being $R_s$) and three composite resistors (the impedances being $Z_1$, $Z_2$, and $Z_3$). The first composite resistor is composed of a parallel circuit of a resistor (the resistance value being $R_0$) and an inductor (the inductance being $L_0$). The second composite resistor is composed of a parallel circuit of a resistor (the resistance value being $R_1$) and a capacitor (the capacitance being $C_1$). The third composite resistor is composed of a parallel circuit of a series circuit of a pair of resistors (the resistance value being $R_2$) and a resistor (the impedance being $Z_W$) and a capacitor (the capacitance being $C_2$). The resistance value r of the internal resistor is defined according to a relational expression (216).

$$r=R_s+Z_1(L_0,R_0)+Z_2(C_1,R_1)+Z_3(C_2,R_2+Z_W) \tag{216}$$

In this case, a partial derivative $(\partial Z/\partial p_i)$ $(Z=R_s, Z_1, Z_2, Z_3)$ calculated for an arbitrary $p_{\_m}=(V_{\_m}, I_{\_m}, T_{\_m})$ by approximating each of $R_s$, $Z_1$, $Z_2$ and $Z_3$ in the same manner as expression (12) may be stored or retained in the first initial characteristic model parameter storage 112 as the first initial characteristic model parameter $q_1$ (V, I, T).

The second initial characteristic model parameter initial characteristic estimated value calculating unit 114 reads, from the first initial characteristic model parameter storage 112, the identifier ID of the secondary battery 220 and the first initial characteristic model parameters $q_1$ corresponding to the present measurement values (V (k), I (k), T (k)) of the plurality of characteristic parameters V, I and T. The second initial characteristic model parameter initial characteristic estimated value calculating unit 114 calculates the resistance value r of the internal resistor as a present initial characteristic estimated value $q_2$ (0←k) of the second initial characteristic model parameter $q_2$ according to a relational expression (218) on the basis of the present measurement values p (k)=(V (k), I (k), T (k)) of the plurality of characteristic parameters of the secondary battery 220 and the first initial characteristic model parameter $q_1$ (p (k)) based on the present measurement values p (k).

$$r(0 \leftarrow k) = r(V_0, 0, T_0) + (\partial r/\partial V)(V(k) - V_0) + (\partial r/\partial I)I(k) \\ + (\partial r/\partial t)(T(k) - T_0) \quad (218)$$

The first characteristic parameter initial characteristic estimated value calculating unit 116 calculates the present initial characteristic estimated value V (0←k) of the voltage V according to a relational expression (220) on the basis of a reference measurement value $V_0$ (j), which is a measurement value V (j) of the voltage V at a last time point t=j at which a current measurement value I (t) of the secondary battery 220 was zero, the present measurement value V (k) of the voltage V, and the present initial characteristic estimated value r (0←k) of the internal resistor (refer to the relational expression (112)).

$$V(0 \leftarrow k) = V_0(j) - I(k) \cdot r(0 \leftarrow k) \quad (220)$$

The measurement value V (j) of the voltage V of the secondary battery 220 is stored or retained in the storage constituting the first characteristic parameter initial characteristic estimated value calculating unit 116. Thereafter, when the current measurement value I (t) of the secondary battery 220 becomes zero, the measurement value V (j) of the voltage V of the secondary battery 220 at that time point is saved in the storage as a present electromotive force $V_0$ (k) of the internal power supply in the initial characteristic model.

The first arithmetic processing element 110 inputs a present measurement value p(k)=(p1 (k), ... pN (k)) of each of a plurality of characteristic parameters p=(p1, ... pN) representing the characteristics of the secondary battery 220 to the function G representing the initial characteristic model thereby to calculate, as an output G (p (k)) of the initial characteristic model, the present initial characteristic estimated value p1 (0←k) of the first characteristic parameter p1 among the plurality of characteristic parameters p. The function G is, for example, a function obtained by substituting the relational expression (218) into the second term of the right side of the relational expression (220).

The first index value calculating unit 121 calculates, as a first index value the cumulative value or the time integration value of values f (V (k), I (k), T (k)) calculated according to the multivariable function f (p) on the basis of the measurement value p (k)=(V (k), I (k), T (k)) of the characteristic parameter p of the secondary battery 220 (refer to the relational expression (121)). The second index value calculating unit 122 calculates, as a second index value $F_2$, the cumulative value or the time integration value of values f (V (0←k), I (k), T (k)) calculated according to the same multivariable function f (V, I, T) on the basis of an initial characteristic estimated value V (0←k) of the voltage V, a measurement value I (k) of the current I, and a measurement value T (k) of the temperature T (refer to the relational expression (122)).

Figure 5:
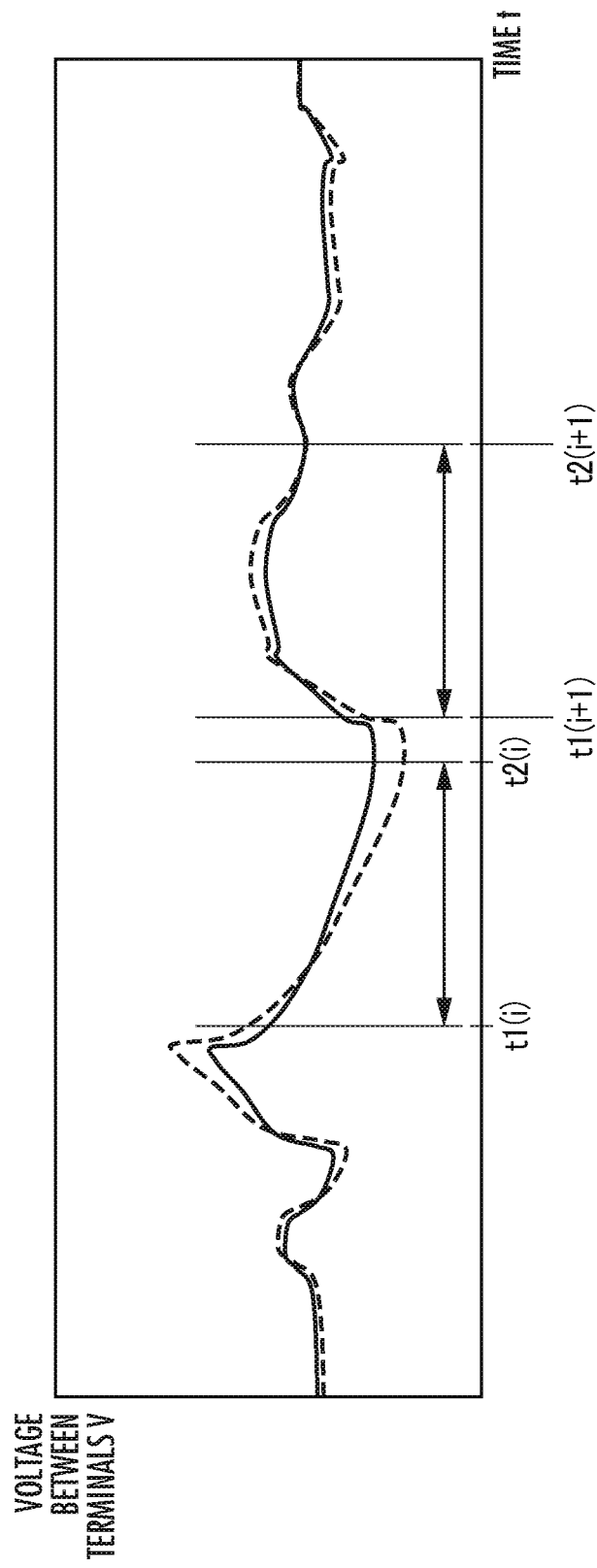
FIG. 5 is an explanatory diagram related to an integration interval for calculating a first index value and a second index value.

In FIG. 5, the temporal change mode of the voltage V (the first characteristic parameter $p_1$ (t)) of the secondary battery 220 in an initial state is indicated by a solid line, and the temporal change mode of the voltage V of the secondary battery 220 in a degraded state is indicated by a dashed line. As illustrated in FIG. 5, an arbitrary period may be adopted as a cumulative interval or an integration interval [$t_1$, $t_2$]. An interval in which the elapsed period from the last time point at which the current I became zero is within a predetermined period may be adopted as the cumulative interval.

In place of the function f, the first index value $F_1$ and the second index value $F_2$ may be calculated by accumulating or integrating the value of the function (dependent variable) as with the relational expressions (121) and (122) according to at least one of functions $f_1$ (V), $f_2$ (V, 1) and $f_3$ (V, T) having at least the voltage V (the first characteristic parameter $p_1$) as the main variable thereof.

The third arithmetic processing element 130 (the degradation degree calculating unit) calculates the degradation degree D (i) of the secondary battery 220 according to the relational expression (130) on the basis of the first index value $F_1$ (i) and the second index value $F_2$ (i).

Degradation State Determination Method

A description will be given of the method fir determining the degradation state of a target carried out by the degradation state determination device having the configuration described above.

Figure 4:
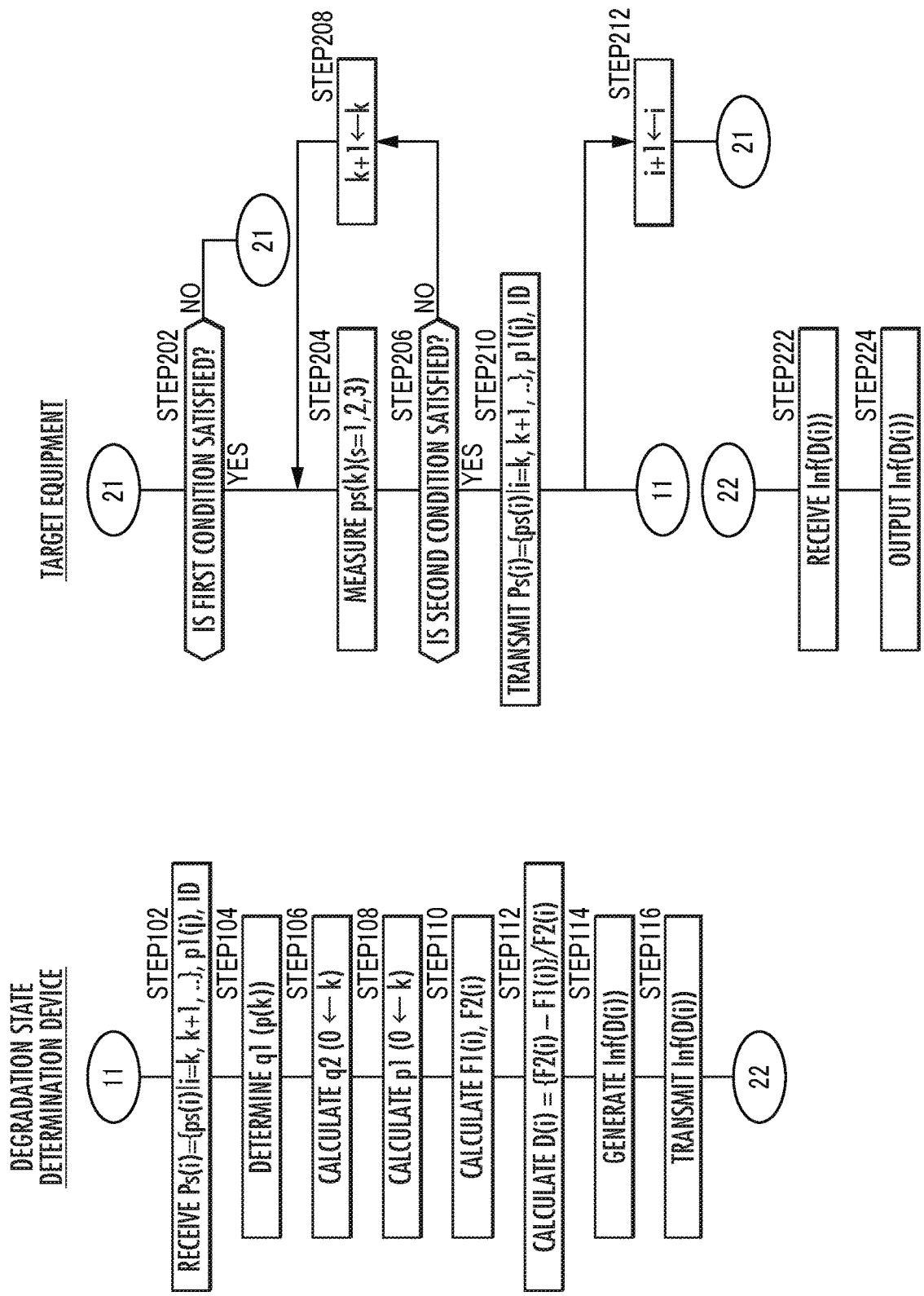
FIG. 4 is an explanatory diagram related to a degradation state determination method as an embodiment of the present invention.

In the target equipment 200, the control unit 210 in an energized state determines whether a first condition is satisfied (STEP202 of FIG. 4). As "the first condition," a condition is adopted, in which a request for determining the degradation state of the secondary battery 220 is received through the input interface 202 in the target equipment 200, in which predetermined application software is started in the target equipment 200, or in which a measurement value of a characteristic parameter of the secondary battery 220 indicates a first change mode.

If it is determined that the first condition is not satisfied (NO in STEP202 of FIG. 4), then processing for determining whether the first condition is satisfied is performed again (STEP202 of FIG. 4). The processing for determining whether the first condition is satisfied (STEP202 of FIG. 4) may be omitted.

If it is determined that the first condition is satisfied (YES in STEP202 of FIG. 4), then the measurement values p (k)=(V (k), I (k), T (k)) of the plurality of characteristic parameters representing the characteristics of the secondary battery 220 are acquired on the basis of an output signal of the sensor group 222 (STEP204 of FIG. 4). "k" denotes an index that indicates discrete time based on a sampling cycle. The voltage V of the secondary battery 220 is measured as the first characteristic parameter $p_1$. The current I (including charging current and discharging current) of the secondary battery 220 is measured as the second characteristic parameter $p_2$. The temperature T of the secondary battery 220 (the ambient temperature or the surface temperature of the housing) is measured as the third characteristic parameter $p_3$. In the process of the measurement, the measurement value V (j) of the voltage V at the last time point at which the current I became zero, t=j, is stored or retained in the memory as the reference measurement value $V_0$ (j).

Subsequently, it is determined by the control unit 210 whether a second condition is satisfied (STEP206 of FIG. 4). As "the second condition," a condition is adopted, in which a second time point is reached after predetermined time elapses from the first time point at which it is determined last that the first condition is satisfied, in which the cumulative value from the first time point of the data indicating the measurement results of the characteristic parameter p (k) reaches a threshold value, or in which the measurement value of a characteristic parameter of the secondary battery 220 measured by the sensor group 222 indicates a second change mode.

If it is determined that the second condition is not satisfied (NO in STEP206 of FIG. 4), then the index k is incremented by 1 (STEP208 of FIG. 4), and then a measurement value $p_s$ (k) of each characteristic parameter $p_s$ (s=1, 2, 3) is acquired (STEP204 of FIG. 4). At this time, a present time series $P_s$ (i)={$p_s$ (i)|i=k, k+1, ... } of the measurement value $p_s$ (k) of the characteristic parameter $p_s$ is cumulatively stored or retained in the memory.

If it is determined that the second condition is satisfied (YES in STEP206 of FIG. 4), then the present time series $P_s$ (i) of the measurement values $p_s$ (k) of the characteristic parameters $p_s$ is transmitted from the target equipment 200 to the degradation state determination device 100 by a transmission device constituting the output interface 204 (STEP210 of FIG. 4). At this time, the identifier ID for identifying the specifications or the type of the secondary battery 220 and the reference measurement value $V_0$ (j) of the voltage V are also transmitted to the degradation state determination device 100 from the target equipment 200. When the transmission is performed, an index i is incremented by 1 (STEP212 of FIG. 4), and then the processing after the determination whether the first condition is satisfied is performed again (refer to STEP202→STEP204→ . . . STEP210 of FIG. 4).

The processing for determining whether the second condition is satisfied (STEP206 of FIG. 4) may be omitted, and the present measurement value $p_s$ (k) of the characteristic parameters $p_s$ may be sequentially transmitted together with the identifier ID and the reference measurement value $V_0$ (j) of the voltage V to the degradation state determination device 100 from the target equipment 200.

In the degradation state determination device 100, an input interface 202 receives the present time series $P_s$ (i) of the measurement values of the characteristic parameters $p_s$ (k), the identifier ID, and the reference measurement value V (j) of the voltage V (STEP102 of FIG. 4).

The first arithmetic processing element 110 (the second initial characteristic model parameter calculating unit 114) reads, from the memory (the first initial characteristic model parameter storage 112 in FIG. 2), the identifier ID and the first initial characteristic model parameters q1 (p (k)) corresponding to the measurement value p (k) of the characteristic parameter p (STEP104 of FIG. 4). The first initial characteristic model parameter q1 is the partial derivative ($\partial r/\partial p_s$) in the foregoing relational expression (212).

The first arithmetic processing element 110 (the second initial characteristic model parameter calculating unit 114) calculates, as the second initial characteristic model parameter $q_2$ (0←k), the present initial characteristic estimated value r (0←k) of the resistance value r of the internal resistor of the secondary battery in an initial state model according to the relational expression (122) on the basis of the present measurement value p (k) of the characteristic parameter p of the secondary battery 220 and the first initial characteristic model parameter $q_1$ (p (k)) (STEP106 of FIG. 4).

The first arithmetic processing element 110 (the first characteristic parameter initial characteristic estimated value calculating unit 116) calculates the present initial characteristic estimated value V (0←k) of the voltage V according to the relational expression (220) on the basis of the reference measurement value $V_0$ (j) of the voltage V, the present measurement value I (k) of the current I, and the present initial characteristic estimated value r (0←k) of the resistance value r of the internal resistor in an initial model (STEP108 of FIG. 4).

The second arithmetic processing element 120 (the first index value calculating unit 121) calculates the first index value $F_1$ (i) according to, for example, the relational expression (121) on the basis of at least the present time series V (i) of the measurement value V (k) of the voltage V as the first characteristic parameter $p_1$ (STEP110 of FIG. 4). The second arithmetic processing element 120 (the second index value calculating unit 122) calculates the second index value $F_2$ (i) according to, for example, the relational expression (122) on the basis of at least the present time series V (i) of the measurement value V (k) of the voltage V as the first characteristic parameter $p_1$ (STEP110 of FIG. 4).

The third arithmetic processing element 130 (the degradation degree calculating unit) calculates the degradation degree D (i) of the secondary battery 220 according to, for example, the relational expression (130) on the basis of the first index value $F_1$ (i) and the second index value $F_2$ (i) (STEP112 of FIG. 4).

The third arithmetic processing element 130 generates degradation diagnosis information Inf (D (i)) based on the degradation degree D (i) of the secondary battery 220 (STEP114 of FIG. 4). The diagnosis information Inf (D (i)) is transmitted from the degradation state determination device 100 to the target equipment 200 by the transmission device constituting the output element 104 (STEP116 of FIG. 4).

Figure 6:
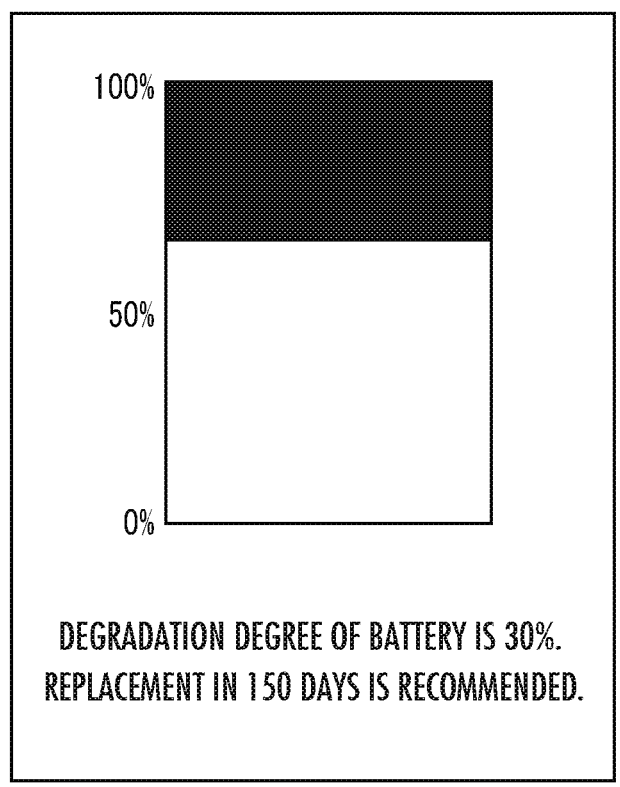
FIG. 6 is an explanatory diagram related to an output example of degradation diagnosis information.

In the target equipment 200, a receiving device constituting the input interface 202 receives the degradation diagnosis information Inf (D (i)) (STEP222 of FIG. 4). The degradation diagnosis information Inf (D (i)) is output to and displayed on a display device constituting the output interface 204 (STEP224 of FIG. 4). Thus, as illustrated in, for example, FIG. 6, a graph indicating the degradation degree D (i) of the secondary battery 220 is displayed, and also a message related to a resolution method based on the degradation degree D (i), such as "Degradation degree of battery is 30%. Replacement in 150 days is recommended," is displayed on the display device.

Effect

Figure 7:
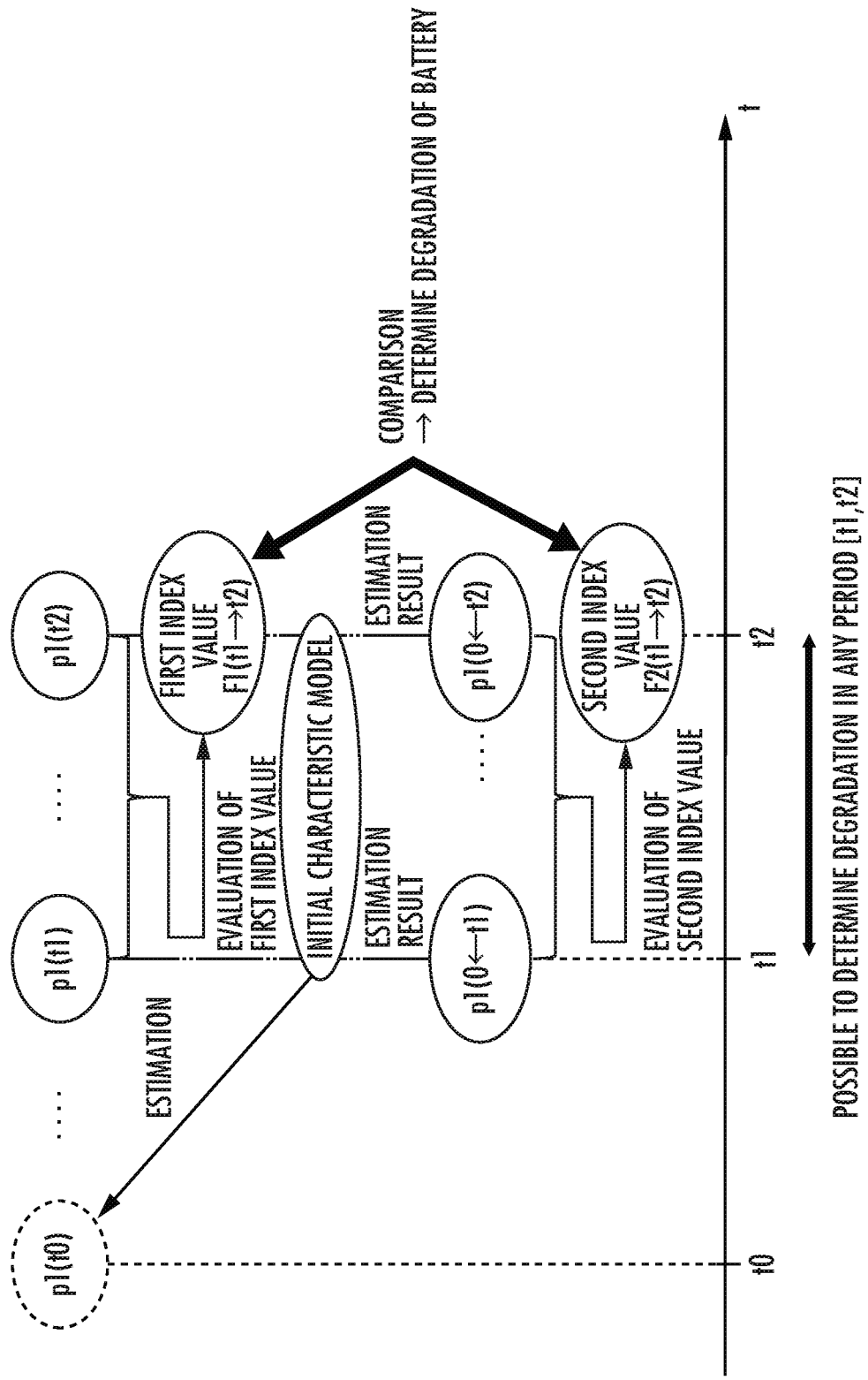
FIG. 7 is a time chart of the degradation state determination method in accordance with the present invention.

According to the degradation state determination device and the degradation state determination method, the measurement of the characteristic parameter p at the initial time point and during the initial period of the secondary battery 220, the degradation state of which is to be determined, is omitted, and the degradation state of the secondary battery 220 is determined on the basis of the measurement results of the characteristic parameter p during a present period $t=t_1 \sim t_2$ having arbitrary start and end points, as illustrated in FIG. 5 and FIG. 7. This makes it possible to shorten the period required for determining the degradation state of the secondary battery 220.

Figure 8:
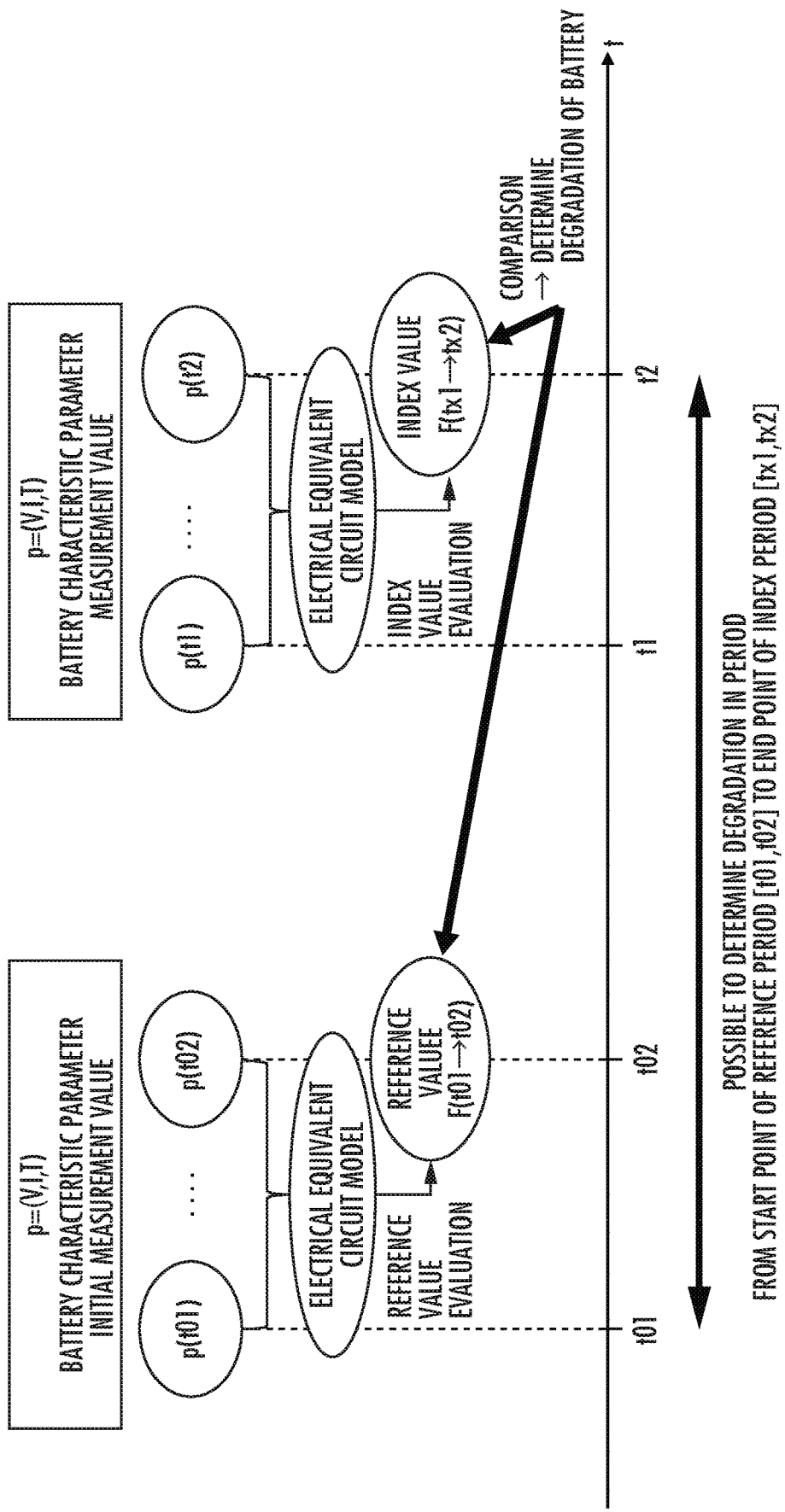
FIG. 8 is a time chart of a degradation state determination method in accordance with a prior art.

On the other hand, according to the prior art, in order to determine the degradation state of the secondary battery 220, it is required to use the present time series of the measurement values of the characteristic parameters p=(V, I, T) of the secondary battery 220 during a certain period $t=t_{x1} \sim t_{x2}$ in addition to the past time series of the measurement values of the characteristic parameters p=(V, I, T) of the secondary battery 220 during a certain period $t=t_{o1} \sim t_{o2}$ before the present time (e.g., an initial state), as illustrated in FIG. 8.

Other Embodiments of the Present Invention

The degradation state determination method for the secondary battery 220 in the foregoing embodiment may be applied to each of a plurality of secondary batteries (cells) which constitute one or common secondary battery module (e.g., a battery) and which share the same specifications.

Figure 9:
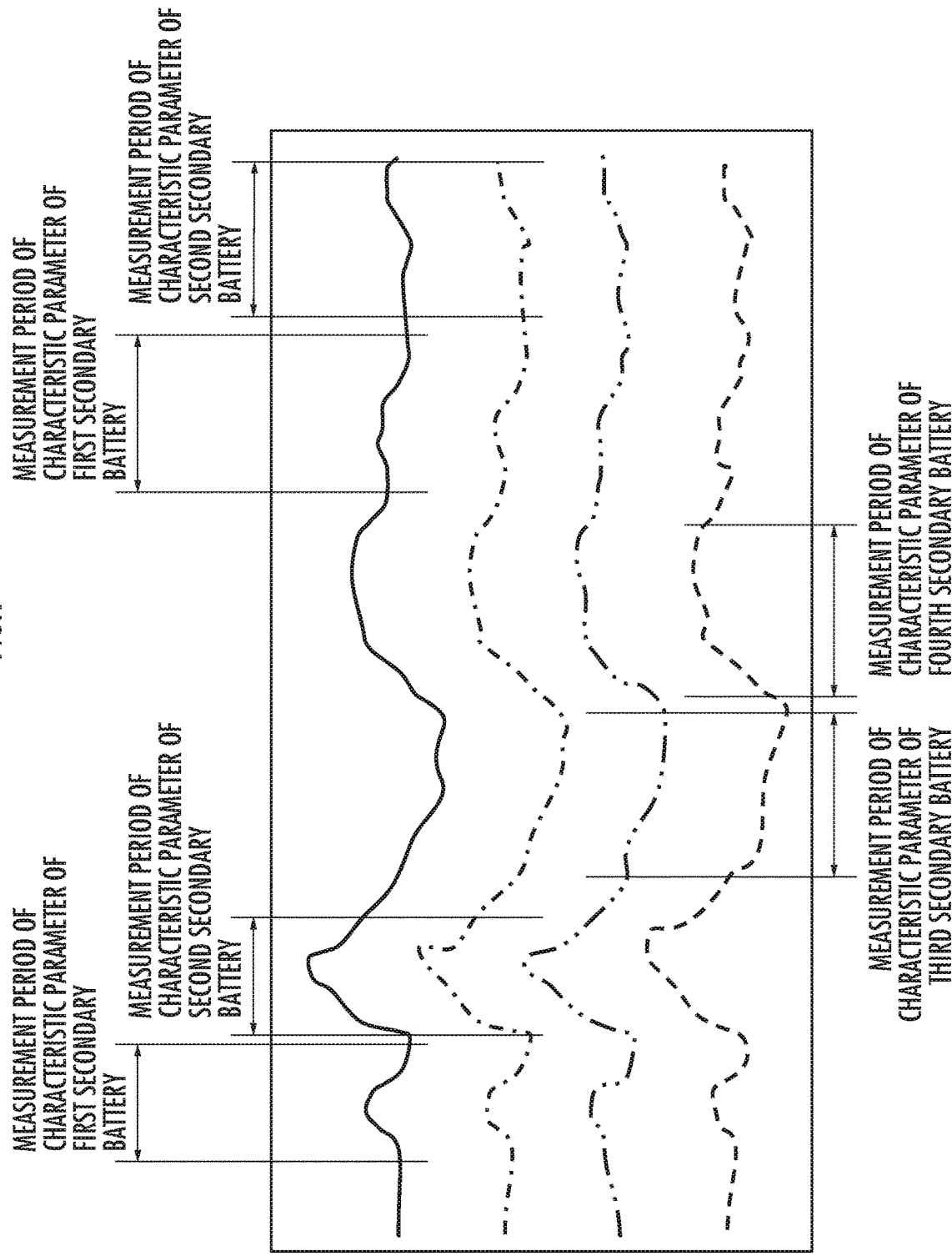
FIG. 9 is an illustrative diagram related to the manners in which the characteristic parameters of each of a plurality of secondary batteries constituting a secondary battery module change.

For each of a plurality of secondary batteries constituting a common secondary battery module, the present measurement values p (k) of a plurality of characteristic parameters p may be measured in each of a plurality of periods that do not mutually overlap. A case will be discussed, in which the characteristic parameter p (the voltage V as the first characteristic parameter $p_1$ in this case) of each of a first to a fourth secondary batteries constituting a secondary battery module changes as illustrated in FIG. 9. Here, for the purpose of ease of looking at the curves of the four characteristic parameters p, the four curves are illustrated, being shifted in the direction of the vertical axis, and therefore, it does not mean that the value of the first characteristic parameter $p_1$ of the first secondary battery is steadily higher than those of the other secondary batteries.

In this case, control is performed such that the measurement periods of the characteristic parameters p of the secondary batteries are not mutually overlapped. The start point of the measurement period of the characteristic parameter p of a {mod (n, 4)+1}-th secondary battery (n=1, 2, 3 or 4) is later than the end point of the measurement period of the characteristic parameter p of an n-th secondary battery. Further, the degradation state of each secondary battery is determined according to the foregoing procedure (refer to FIG. 4). The same applies to cases where the number of secondary batteries constituting a secondary battery module is less than or more than four.

In the foregoing other embodiment, the degradation state may be determined on the single secondary battery or each of the plurality of secondary batteries constituting a degraded secondary battery group having a predetermined value or more of the degradation degree D (i), which indicates the degradation state, among the plurality of secondary batteries constituting the single secondary battery module. In other words, among the plurality of secondary batteries constituting the secondary battery module, the degradation state of a secondary battery having a relatively higher degradation degree is determined with priority given to the remaining secondary batteries.

DESCRIPTION OF REFERENCE NUMERALS

100 . . . degradation state determination device; 102 . . . input element; 104 . . . output element; 110 . . . first arithmetic processing element; 112 . . . first initial characteristic model parameter storage; 114 . . . second initial characteristic model parameter initial characteristic estimated value calculating unit; 116 . . . first characteristic parameter initial characteristic estimated value calculating unit; 120 . . . second arithmetic processing element; 121 . . . first index value calculating unit; 122 . . . second index value calculating unit; 130 . . . third arithmetic processing element (degradation degree calculating unit); 200 . . . target equipment; 202 . . . input interface; 204 . . . output interface; 210 . . . control unit; 220 . . . secondary battery; and 222 . . . sensor group.

The invention claimed is:

1. A degradation state determination device comprising:
a processor including a first arithmetic processing element, a second arithmetic processing element, and a third arithmetic processing element;
wherein the first arithmetic processing element obtains a measurement value of each of a voltage (V) and a current (I) of a secondary battery as a plurality of characteristic parameters representing characteristics of the secondary battery based on an output of each of a voltage sensor and a current sensor connected to the secondary battery, and calculates an initial characteristic estimated value (V(0←k)) according to an initial characteristic model based on a present measurement value (V(k), I(k)) at a determination time point (k) of each of the plurality of characteristic parameters (V, I), wherein an output of the initial characteristic model includes, as a first characteristic parameter (V) among the plurality of characteristic parameters (V, I), the initial characteristic estimated value (V(0←k)), which is defined as a value at a past initial time point (0) before the determination time point (k) of the voltage (V), the initial characteristic model being defined by a multivariable function (G) having the plurality of characteristic parameters (V, I) as main variables and representing an initial characteristic of a reference battery having the same specifications as those of the secondary battery;

the second arithmetic processing element calculates a value (f(V(k))) of a specified function (f) having the first characteristic parameter (V) as a main variable based on the measurement value (V(k)) of the first characteristic parameter obtained by the first arithmetic processing element to calculate a cumulative value or an integral value of a value of the specified function (f) during a period of determination including the determination time point (k) as a first index value ($F_1$) indicating a present state of the secondary battery, and calculates a value (f(V(0←k))) of the specified function (f) based on the initial characteristic estimated value (V(0←k)) of the first characteristic parameter calculated by the first arithmetic processing element to calculate a cumulative value or an integral value during a period of determination of a value (f(V(0←k)) of the specified function (f) as a second index value ($F_2$) indicating an initial state of the secondary battery; and the third arithmetic processing element determines that a degradation degree (D) of the secondary battery, according to an expression for calculating the degradation degree, is higher with reference to an initial state of the secondary battery as a result of calculating an increasing deviation between the first index value ($F_1$) and the second index value ($F_2$) calculated by the second arithmetic processing element;

wherein the first arithmetic processing element calculates a second initial characteristic model parameter (($\partial r/\partial V$)$_{V=V\ (0\leftarrow k)}$, ($\partial r/\partial I$)$_{I=I\ (0\leftarrow k)}$) representing an initial characteristic of an internal resistor (r) of the secondary battery based on a present measurement value of at least one characteristic parameter (V(k), I(k)) among the plurality of parameters (V, I), and a first initial characteristic model parameter (($\partial r/\partial V$)$_{V=V\ (k)}$, ($\partial r/\partial I$)$_{I=I(k)}$) representing an initial characteristic of an internal resistor (r) of the reference battery, and calculates a present initial characteristic estimated value (V(0←k)) of the voltage (V) as the first characteristic parameter based on a present measurement value (I(k)) of the current (I) as a second characteristic parameter that is different from the first characteristic parameter (V), and a present calculated value of the second initial characteristic model parameter (($\partial r/\partial V$)$_{V=V\ (0\leftarrow k)}$, ($\partial r/\partial I$)$_{I=I\ (0\leftarrow k)}$); and wherein the first arithmetic processing element calculates a present initial characteristic estimated value (V(0←k)) of the voltage (V) as the first characteristic parameter based on a reference measurement value (V(j)) of the voltage (V) as the first characteristic parameter at a reference time (j) as a latest time point at which a measurement value of the current (I) as the second characteristic parameter was zero in addition to the present measurement value (I(k)) of the current (I) as the second characteristic parameter and the present calculated value of the second initial characteristic model parameter $((\partial r/\partial V)_{V=V(0\leftarrow k)}, (\partial r/\partial I)_{I=I(0\leftarrow k)})$;

an input element that receives a measurement value of each of the plurality of characteristic parameters (V(k), I(k)) from target equipment in which the secondary battery is mounted; and an output element that transmits, to the target equipment, degradation diagnosis information representing a degradation degree (D) calculated by the third arithmetic processing element.

2. The degradation state determination device according to claim 1, wherein the second arithmetic processing element calculates a cumulative value ($\Sigma_1 f(V(k))$) or an integral value of a value of the specified function (f) based on the measurement value (V(k)) of the first characteristic parameter during the period of determination from the reference time (j) to the elapse of a specified period, as the first index value ($F_1$) and calculates a cumulative value ($\Sigma_1 f(V(0\leftarrow k))$) or an integral value of a value ($f(V(0\leftarrow k))$) of the specified function (f) based on the initial characteristic estimated value ($V(0\leftarrow k)$) of the first characteristic parameter calculated by the first arithmetic processing element during the period of determination from the reference time (j) to the elapse of the specified period, as the second index value ($F_2$).

3. The degradation state determination device according to claim 1, wherein the first arithmetic processing element inputs, to the initial characteristic model, a present measurement value (V(k), I(k)) of each of the plurality of characteristic parameters (V, I) in each of a plurality of periods of determination that do not mutually overlap for each of a plurality of secondary batteries which constitute a single secondary battery module and which have the same specifications, thereby calculating an initial characteristic estimated value ($V(0\leftarrow k)$) of the voltage (V) as the first characteristic parameter according to the multivariable function (G) defining the initial characteristic model, and the second arithmetic processing element calculates, for each of the plurality of secondary batteries, a cumulative value ($\Sigma_1 f(V(k))$) or an integral value of a value of the specified function (f) based on the measurement value (V(k)) of the first characteristic parameter during each of the periods of determination from the reference time (j) to the elapse of a specified period, as the first index values ($F_1$), and calculates a cumulative value ($\Sigma_1 f(V(0\leftarrow k))$) or an integral value of a value ($f(V(0\leftarrow k))$) of the specified function (f) based on the initial characteristic estimated value ($V(0\leftarrow k)$) of the first characteristic parameter calculated by the first arithmetic processing element during each of the periods of determination from the reference time (j) to the elapse of the specified period, as the second index values ($F_2$), and the third arithmetic processing element determines, for each of the plurality of secondary batteries, a degradation degree (D) based on the first index values ($F_1$) and the second index values ($F_2$) calculated by the second arithmetic processing element.

4. The degradation state determination device according to claim 3, wherein the first arithmetic processing element calculates the initial characteristic estimated value $V(0\leftarrow k)$ of the voltage (V) as the first characteristic parameter for a single secondary battery or each of the plurality of secondary batteries constituting a degraded secondary battery group having a degradation degree (D) calculated by the third arithmetic processing element equal to or more than a predetermined value among the plurality of secondary batteries, the second arithmetic processing element calculates the first index value ($F_1$) and the second index value ($F_2$) for a single secondary battery or each of the plurality of secondary batteries constituting the degraded secondary battery group, and the third arithmetic processing element calculates, for a single secondary battery or each of the plurality of secondary batteries constituting the degraded secondary battery group, a degradation degree (D) based on the first index value ($F_1$) and the second index value ($F_2$) calculated by the second arithmetic processing element.

5. A software server that allows software for determining degradation to be downloaded to an arithmetic processing device provided in target equipment having the secondary battery, thereby imparting, to the arithmetic processing device, a function as the degradation state determination device according to claim 1.

6. A degradation state determination method that performs:

first arithmetic processing for obtaining a measurement value of each of a voltage (V) and a current (I) as a plurality of characteristic parameters representing characteristics of a secondary battery based on an output of each of a voltage sensor and a current sensor connected to the secondary battery, and calculating an initial characteristic estimated value ($V(0\leftarrow k)$) according to an initial characteristic model and based on a present measurement value (V(k), I(k)) at a determination time point (k) of each of the plurality of characteristic parameters (V, I), wherein an output of the initial characteristic model includes, as a first characteristic parameter (V) among the plurality of characteristic parameters (V, I), the initial characteristic estimated value ($V(0\leftarrow k)$), which is defined as a value at a past initial time point (0) before the determination time point (k) of the voltage (V), the initial characteristic model being defined by a multivariable function (G) having the plurality of characteristic parameters (V, I) as main variables and representing an initial characteristic of a reference battery having the same specifications as those of the secondary battery;

second arithmetic processing for calculating a value (f(V(k))) of a specified function (f) having the first characteristic parameter (V) as a main variable based on the measurement value (V(k)) of the first characteristic parameter obtained by the first arithmetic processing element to calculate a cumulative value or an integral value of a value of the specified function (f) during a period of determination including the determination time point (k) as a first index value ($F_1$), which indicates a present state of the secondary battery, and also for calculating a value ($f(V(0\leftarrow k))$) of the specified function (f) based on the initial characteristic estimated value ($V(0\leftarrow k)$) of the first characteristic parameter calculated by the first arithmetic processing to calculate a cumulative value or an integral value during a period of determination of a value ($f(V(0\leftarrow k))$) of the specified function (f) as a second index value ($F_2$), which indicates an initial state of the secondary battery; and third arithmetic processing for calculating whether a degradation degree (D) of the secondary battery according to an expression for calculating the degradation degree is higher with reference to an initial state of the secondary battery as a result of calculating an increasing deviation between the first index value ($F_1$)

and the second index value ($F_2$) calculated by the second arithmetic processing is larger.

\* \* \* \* \*